(12) United States Patent
Maki

(10) Patent No.: US 6,809,404 B2
(45) Date of Patent: Oct. 26, 2004

(54) SEMICONDUCTOR DEVICE

(75) Inventor: Yasuhiko Maki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/393,917

(22) Filed: Mar. 24, 2003

(65) Prior Publication Data
US 2003/0218932 A1 Nov. 27, 2003

(30) Foreign Application Priority Data
May 22, 2002 (JP) ........................................ 2002-147008

(51) Int. Cl.[7] .............................................. H01L 23/58
(52) U.S. Cl. ......................................... 257/665; 257/429
(58) Field of Search ................................ 257/409, 528, 257/529, 773, 665

(56) References Cited
U.S. PATENT DOCUMENTS 5,444,012 A * 8/1995 Yoshizumi et al. ............ 438/6
5,757,060 A * 5/1998 Lee et al. .................... 257/529
6,667,917 B1 * 12/2003 Templeton et al. ......... 365/201

FOREIGN PATENT DOCUMENTS

| JP | 05-251563 | 9/1993 |
|----|-----------|--------|
| JP | 11-017018 | 1/1999 |

* cited by examiner

*Primary Examiner*—Roy Potter
(74) *Attorney, Agent, or Firm*—Arent Fox PLLC

(57) ABSTRACT

A semiconductor device with laser-programmable fuses for repairing a memory defect found after production, in which guard rings and fuse patterns are designed to take up less chip space. The semiconductor device has a fuse pattern running parallel to the longitudinal axis of a rectangular guard ring, and patterns branching from the fuse pattern and drawn out of the guard ring in the direction perpendicular to that axis. The semiconductor device also has a plurality of memory cell arrays, each coupled to an I/O port for receiving and sending memory signals. One of those arrays is reserved as a redundant memory cell array for repair purposes. The device further has switch circuits for switching the connection between the I/O ports and memory cell arrays, selecting either default memory cell arrays of the I/O ports or their adjacent memory cell arrays, including the redundant memory cell array.

7 Claims, 7 Drawing Sheets

| XRS1 | RS1 | XRS2 | RS2 | XRS3 | RS3 | XRS4 | RS4 | XRS5 | RS5 |
|---|---|---|---|---|---|---|---|---|---|
| L | H | L | H | L | H | L | H | L | H |

FIG. 3(A)

| XRS1 | RS1 | XRS2 | RS2 | XRS3 | RS3 | XRS4 | RS4 | XRS5 | RS5 |
|---|---|---|---|---|---|---|---|---|---|
| L | H | L | H | H | L | H | L | H | L |

FIG. 3(B)

SEMICONDUCTOR DEVICE

CROSS-REFERENCE TO RELATED APPLICATIONS

This application is based upon and claims priority of Japanese Patent Application No. 2002-147008, filed on May 22, 2002, the contents being incorporated herein by reference.

BACKGROUND OF THE INVENTION

1. Field of the Invention

The present invention relates to a semiconductor device, and particularly to a semiconductor device with fuses for repairing a defect found after production.

2. Description of the Related Art

A class of semiconductor devices containing memory circuits have a redundant memory cell array to repair a memory defect that is found after production. The repair process decouples the defective memory cell array from other circuits by blowing laser-programmable fuses provided in the device, and recovers its function with the redundant array that is now activated. In the chip structure, fuse patterns are each arranged under a rectangular guard ring, so that a laser beam directed to the inside of the guard ring will hit the intended fuse pattern. FIGS. 6(A) and (B) illustrate a guard ring and a fuse pattern formed on a semiconductor device. Specifically, FIG. 6(A) is a plan view, and FIG. 6(B) is a cross-sectional view taken along the line 100—100 in FIG. 6(A).

As shown in FIGS. 6(A) and (B), the semiconductor device has an insulating film layer 41 formed on a semiconductor substrate 40, and a fuse pattern 42 is placed in that insulating film layer 41. A window 41a is etched at the upper part of the insulating film 41, so that a laser beam can reach the fuse pattern 42 from above the window 41a. Deposited along the rim of the window 41a is a guard ring 43. In order to blow the fuse pattern 42, the laser beam spot is targeted into the window 41a. The fuse pattern 42 is then melted by the energy of the laser beam and becomes open. For reliable operation, fuse patterns should be blown at two spots for each.

Think of, for example, a static RAM (SRAM) device having such fuse patterns as part of its built-in repair function. Actually, there are two ways of arranging fuse patterns and guard rings on a chip, depending on how they are to be used. One way is to provide a guard ring for each individual fuse pattern, and the other is to form a single guard ring shared by a group of several fuse patterns. FIGS. 7(A) and (B) show how guard rings and fuse patterns are arranged in a conventional semiconductor device. Specifically, FIG. 7(A) shows a one-on-one arrangement, while FIG. 7(B) shows a one-on-multiple arrangement.

In the semiconductor device design shown in FIG. 7(A), fuse patterns 51a to 51e have their dedicated guard rings 50a to 50e, one for each. A RAM macro 52 is a group of memory cell arrays, to which a signal is supplied from a signal line 53 through the corresponding fuse patterns 51a to 51e. The RAM macro 52 is designed such that blowing one of the fuse patterns 51a to 51e will interrupt the signal to the corresponding memory cell array, and the function of that memory cell array can be replaced by a redundant memory cell array.

In another semiconductor device design shown in FIG. 7(B), a plurality of fuse patterns 61a to 61e are arranged within a single guard ring 60 to repair, if necessary, a defect in a RAM macro 62, whose function is the same as that of the RAM macro 52 shown in FIG. 7(A). When one of the fuse patterns 61a to 61e is blown, the corresponding memory cell array is disabled because the connection to a signal line 63 is lost. The RAM macro 62 is designed to replace the disabled memory cell array with a redundant memory cell array in itself.

These days, integrated circuits are getting denser and denser, and accordingly, it is desired to reduce the chip space occupied by guard rings and fuse patterns. The fuse pattern arrangement of FIG. 7(A), however, takes up a great deal of chip space since every fuse requires space for a window and a guard ring. While the arrangement of FIG. 7(B) is more efficient than that of FIG. 7(A) in terms of the fuse and guard ring areas, the conductors connecting each fuse pattern with the RAM macro consume a large space. Further, there is a limit to the reduction of its lengthwise dimension, which is indicated by the bidirectional arrow A in FIG. 7(B), because each fuse pattern should be long enough to receive laser beams at two different spots.

SUMMARY OF THE INVENTION

In view of the foregoing, an object of the present invention is to provide a semiconductor device in which guard rings and fuse patterns are designed to take up less chip space.

In order to achieve the above object, the invention provides a semiconductor device with fuses for repairing a defect found therein. The semiconductor device comprises: a guard ring; a fuse pattern running in a direction parallel to longitudinal axis of the guard ring; a plurality (n) of branching patterns branching from the fuse pattern and being drawn out of the guard ring in a direction perpendicular to the longitudinal axis of the guard ring; a plurality (n+1) of memory cell arrays, the (n+1)th memory cell array being a redundant memory cell array; a plurality (n) of input/output ports for receiving and sending memory signals; a plurality (n) of switch circuits, coupled to different points on the fuse pattern through the plurality of branching patterns, which switch connection between the input/output ports and memory cell arrays, the ith switch circuit (i=1 . . . n) selecting either the ith memory cell array or the (i+1)th memory cell array, depending on which segment of the fuse pattern is blown.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 3(A) and (B) show the state of each output signal of latch circuits. Specifically, FIG. 3(A) shows the signal states when the fuse pattern is intact, and FIG. 3(B) shows the signal states when a part of the fuse pattern has been blown.

FIG. 6(A) is a plan view.

FIG. 7(A) shows a one-on-one arrangement.

DESCRIPTION OF THE PREFERRED EMBODIMENTS

Preferred embodiments of the present invention will be described below, referring to the accompanying drawings.

Figure 1:
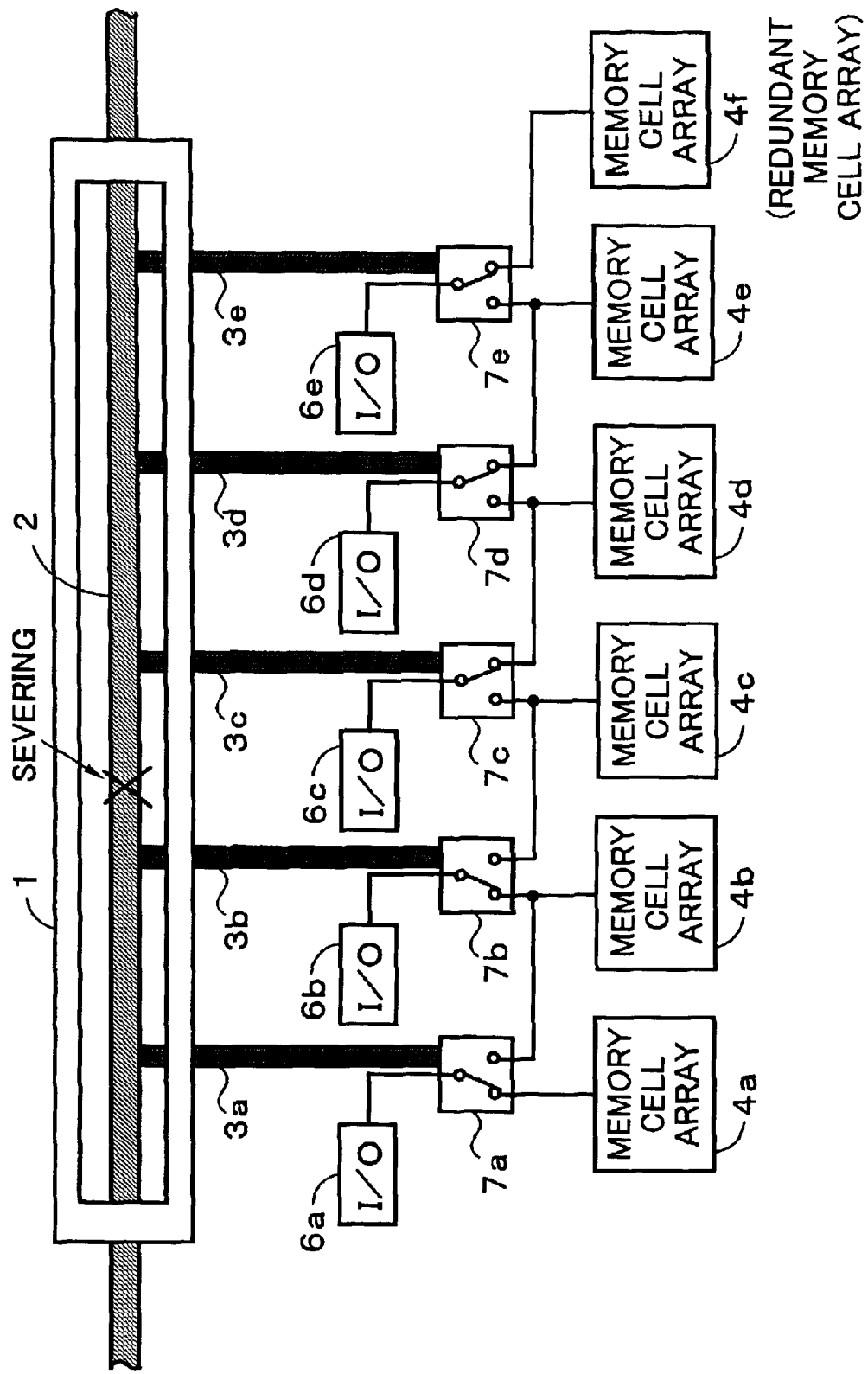
FIG. 1 is a diagram showing a structure of a semiconductor device according to a first embodiment of the invention.

FIG. 1 is a diagram showing a structure of a semiconductor device according to a first embodiment of the invention. As shown in FIG. 1, the semiconductor device has a rectangular guard ring 1, a fuse pattern 2 running in the direction parallel to the longitudinal axis of the guard ring 1, and patterns 3a to 3e branching from the fuse pattern 2 and being drawn out of the guard ring 1 in the direction perpendicular to the longitudinal axis of the guard ring 1. The semiconductor device also has a plurality of memory cell arrays 4a to 4e, each corresponding to an input/output (I/O) port 6a to 6e for receiving and sending memory signals. There is an extra memory cell array 4f provided as a redundant memory cell array for use, if necessary, in repairing a memory defect that may be found after production. Switch circuits 7a to 7e switch the connection between the I/O ports 6a to 6e and memory cell arrays 4a to 4f, selecting either their default memory cell arrays or their adjacent memory cell arrays including the redundant memory cell array 4f. To state this in a more generalized way, the ith switch circuit (i=1 . . . 5) is designed to select either the ith memory cell array or the (i+1)th memory cell array, depending on which segment of the fuse pattern is blown.

The switch circuits 7a to 7e are connected to the fuse pattern 2 through the branching patterns 3a to 3e. Normally (i.e., with no fuses blown), the switch circuits 7a to 7e connects the I/O ports 6a to 6e with their corresponding memory cell arrays 4a to 4e, respectively. Those memory cell arrays 4a to 4e are therefore referred to as the "default memory cell arrays" of the I/O ports 6a to 6e. When a certain segment of the fuse pattern 2 is blown, the switch circuits 7a to 7e modify the above default associations between the I/O ports and memory cell arrays. Specifically, they shifts the associations by connecting the I/O ports 6a to 6d to their adjacent memory cell arrays 4b to 4e and the rightmost I/O ports 6e to the redundant memory cell array 4f. More specifically, the leftmost I/O port 6a is connected to the second memory cell array 4b, the second I/O port 6b to the third memory cell array 4c, the third I/O 6c port to the fourth memory cell array 4d, the fourth I/O port 6d to the fifth memory cell array 4e, and the rightmost I/O port 6e to the redundant memory cell array 4f.

The entire shift of associations described above, however, only occurs in a particular case; the scope of the shift operation actually depends on which segment of the fuse pattern 2 is blown. Let us suppose, for example, that the third memory cell array 4c is found defective. To repair this memory defect, the fuse pattern 2 is blown at a segment between the second and third branching patterns 3b and 3c as indicated by the cross symbol in FIG. 1, which causes the rightmost three switch circuits 7c, 7d, and 7e to change the connection of their corresponding I/O ports 6c, 6d, and 6e to the rightmost three memory cell arrays 4d, 4e, and 4f, respectively.

Figure 7A:
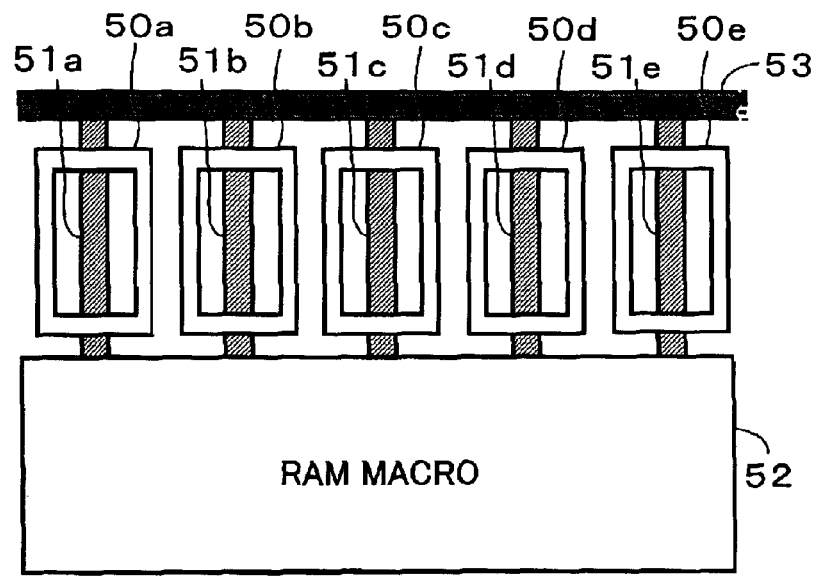
FIGS. 7(A) and (B) each show an arrangement of guard rings and fuse patterns in a conventional semiconductor device. Specifically.
Figure 7B:
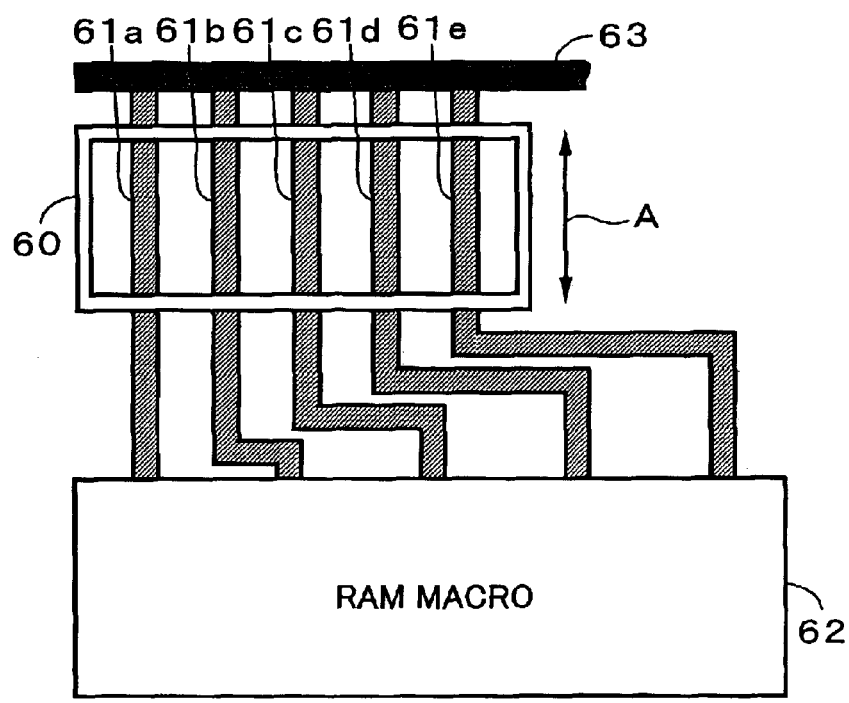
FIG. 7(B) shows a one-on-multiple arrangement.

As described above, the proposed semiconductor device designed to repair a memory defect by disconnecting the defective memory cell array and putting instead a redundant memory cell array to use, by blowing an appropriate part of the fuse pattern. Since the proposed fuse pattern is arranged to extend parallel to the longitudinal axis of the guard ring 1, with branching patterns 3a to 3e drawn out of the guard ring 1 in a perpendicular direction, the chip space required for this guard ring 1 and fuse pattern 2 can be greatly reduced. Specifically, compare the proposed rectangular guard ring 1 with the conventional guard ring 50a described earlier in FIG. 7(A). Specifically, the width of the proposed guard ring 1 is about 50 percent smaller than the length of the conventional guard ring 50a which is measured in the direction of its fuse pattern 51a. In the next section, a more specific circuit structure of the semiconductor device of FIG. 1 will be described with reference to FIG. 2.

Figure 2:
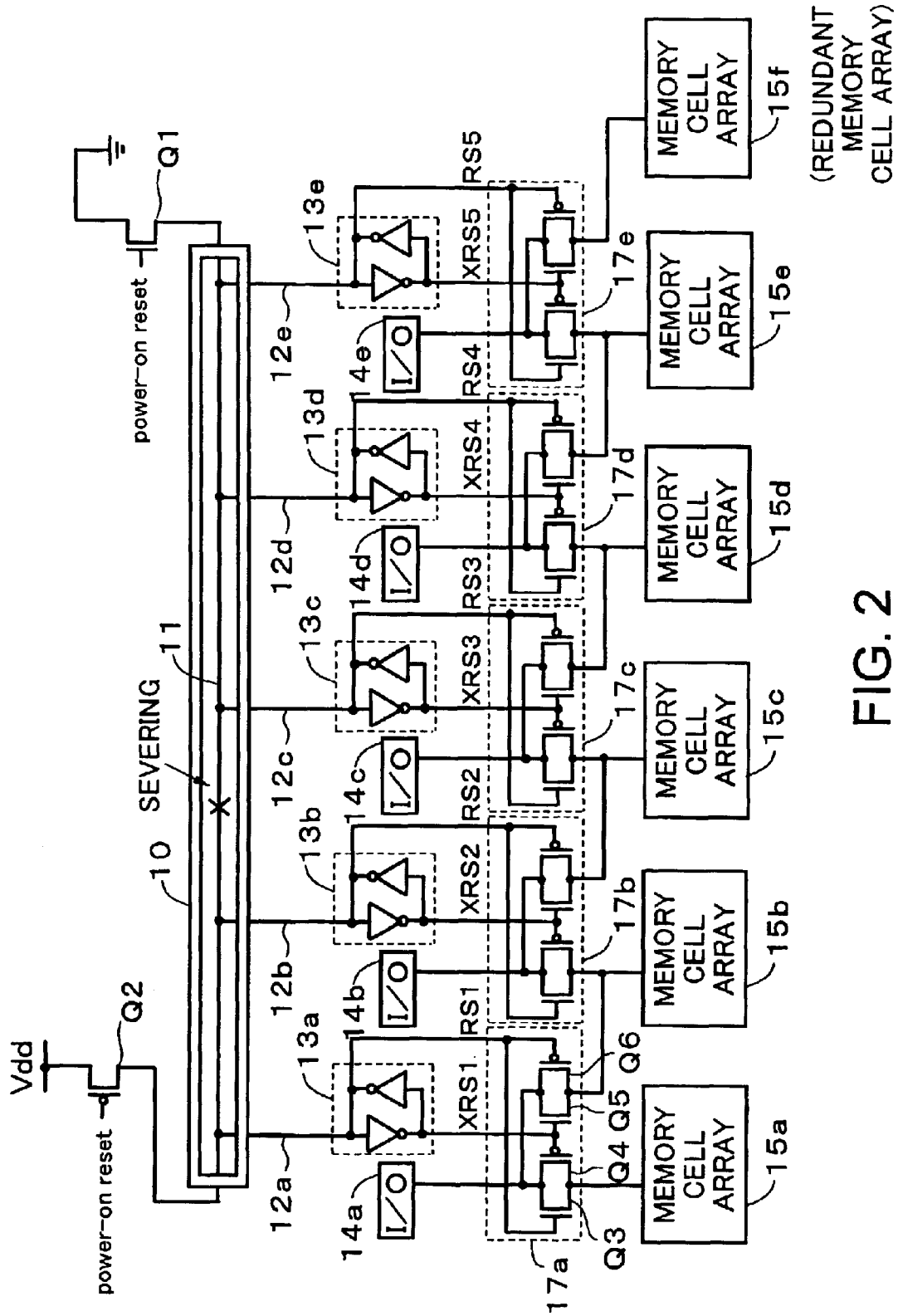
FIG. 2 is a circuit diagram of the semiconductor device shown in FIG. 1.

FIG. 2 is a circuit diagram of the semiconductor device shown in FIG. 1. The circuit shown in FIG. 2 includes the following elements: a fuse pattern 11 running in the direction parallel to the longitudinal axis of its corresponding rectangular guard ring 10 formed on the semiconductor device, a first transistor Q1 connected to one end of the fuse pattern 11, and a second transistor Q2 connected to the other end of the fuse pattern 11. The circuit also includes patterns 12a to 12e branching from the fuse pattern 11 toward the outside of the guard ring 10 in the direction perpendicular to the guard ring axis. Those branching patterns 12a to 12e reach latch circuits 13a to 13e, respectively. The circuit of FIG. 2 further includes memory cell arrays 15a to 15e corresponding to I/O ports 14a to 14e for receiving and sending memory signals, and an extra memory cell array 15f for redundancy. This redundant memory cell array 15f is a spare memory cell array to be used to repair a memory defect, if any. The circuit further includes switch circuits 17a to 17e that would change, if required, the connection between the I/O ports 14a to 14e and memory cell arrays, selecting either their default memory cell arrays 15a to 15e or their respective adjacent memory cell arrays 15b to 15f (one of which is a redundant memory cell array).

A power-on reset signal is supplied to the gates of the two transistors Q1 and Q2, which is asserted to "H" (high) state when the semiconductor device is powered up and then returned to "L" (low) state for normal operation. That is, the fuse pattern 11 is driven to the ground level (i.e., "L" state) through the first transistor Q1 for a while after power-up, and then pulled up to the power source voltage Vdd (i.e., "H" state) through the second transistor Q2.

The latch circuits 13a to 13e, each comprising two inverters connected in a loop, are supplied with a signal in either "L" or "H" state from their corresponding branching patterns 12a to 12e. Each latch circuit memorizes that state even after their inputs are removed. They provide both inverted and non-inverted latched outputs. For example, the first (i.e., leftmost) latch circuit 13a in FIG. 2 provides a non-inverted output RS1 and an inverted output XRS1.

The switch circuits 17a to 17e are configured as follows. The first switch circuit 17a, for example, is composed of four transistors Q3 to Q6. The drain and source of Q3 are connected to the drain and source of Q4, respectively. Likewise, the drain and source of Q5 are connected to the drain and source of Q6, respectively. The gates of Q3 and Q6 are connected together to the branching pattern 12a, or the non-inverted output RS1 of the latch circuit 13a. The gates of the transistors Q4 and Q5 are connected together to the inverted output XRS1 of the latch circuit 13a.

The switch circuit 17a connects the I/O 14a with either the first memory cell array 15a or the adjacent second memory cell array 15b, depending on the signal coming from the pattern 12a and the resulting state of the latch circuit 13a. For example, if a signal in "H" state is supplied from the pattern 12a, the latch circuit 13a sets its non-inverted output RS1 to "H" and its inverted output XRS1 to "L." This state of the latch circuit 13a turns on the transistors Q3 and Q4, while turning off the other transistors Q5 and Q6. Thus, the I/O port 14a is connected to the first memory cell array 15a through the transistors Q3 and Q4.

Conversely, if a signal in "L" state is supplied from the pattern 12a, the latch circuit 13a sets its non-inverted output RS1 to "L" and its inverted output XRS1 to "H.". This state of the latch circuit 13a turns on the transistors Q5 and Q6, while turning off the other transistors Q3 and Q4. Thus, the I/O port 14a is connected to the second memory cell array 15b, which is adjacent to the first memory cell array 15a, through the transistors Q5 and Q6. The other switch circuits 17b to 17e operate in the same way as the first switch circuit 17a described above, and no explanation will be given here for them.

The action of the circuit shown in FIG. 2 will now be described below, separately for the following two different cases: when the fuse pattern 11 is intact, and when a part of the fuse pattern 11 is blown. FIGS. 3(A) and (B) show the output states of the latch circuits. Specifically, FIG. 3(A) shows the states of latch output signals when the fuse pattern 11 is intact, and FIG. 3(B) shows those when the fuse pattern 11 is blown. In FIGS. 3(A) and (B), XRS1 to XRS5 denote the inverted outputs of the latch circuits 13a to 13e in FIG. 2, and RS1 to RS5 denote the non-inverted outputs of them.

The circuit of FIG. 2 operates as follows in the case the fuse pattern 11 is intact. When the semiconductor device is powered up, a power-on reset signal in "H" state is supplied to the respective gates of two transistors Q1 and Q2. Since this signal activates the first transistor Q1, the fuse pattern 11 is connected to the ground and thus set to an "L" state. After a while, the power-on reset signal is negated, making the first transistor Q1 turn off and the second transistor Q2 turn on. The fuse pattern 11 is now connected to the power source voltage Vdd and thus driven to an "H" state. This "H" state of the fuse pattern 11 gives the final output state of the latch circuits 13a to 13e as shown in FIG. 3(A), so that the switch circuits 17a to 17e connect all the I/O ports 14a to 14e to their default memory cell arrays 15a to 15e, respectively.

The circuit of FIG. 2 operates as follows in the case a part of the fuse pattern 11 has been blown. Suppose, for example, that the third memory cell array 15c is found defective after production. In order to solve the problem with this defective memory cell array 15c using the redundant memory cell array 15f, the fuse pattern 11 should be blown at the segment between the second and third branching patterns 12b and 12c. The fuse pattern 11 is now divided into two parts, left and right, at the blown spot indicated by the cross symbol in FIG. 2.

When the semiconductor device is powered up, a power-on reset signal in "H" state is supplied to the respective gates of two transistors Q1 and Q2. Since this signal activates the first transistor Q1, the right side of the divided fuse pattern 11 is connected to the ground and set to an "L" state. The left side of the fuse pattern 11, on the other hand, is in an indefinite state at this moment because the transistor Q2 is in an inactive state. After a while, the power-on reset signal is nagated, which makes the first transistor Q1 turn off and the second transistor Q2 turn on. Thus, the left side of the divided fuse pattern 11 in FIG. 2 is applied a power source voltage Vdd and thus set to an "H" state. The right side of the fuse pattern 11 still remains in the "L" state after the transistor Q1 is turned off, because the latch circuits 13c to 13e memorize that state.

As a result, each latch circuit 13a to 13e is finally set to the state shown in FIG. 3(B). The first switch circuit 17a therefore connects the first I/O port 14a to the first memory cell array 15a, and the second switch circuit 17b connects the second I/O port 14b to the second memory cell array 15b. The third switch circuit 17c, however, connects the third I/O port 14c, not to the defective memory cell array 15c, but to the fourth memory cell array 15d adjacent thereto. The fourth switch circuit 17d then connects the fourth I/O port 14d to the fifth memory cell array 15e, and the fifth switch circuit 17e connects the fifth I/O port 14e to the sixth memory cell array 15f, which is the redundant array.

To sum up, the illustrated switch circuits 17a to 17e are designed to connect their corresponding I/O ports either to their respective default memory cell arrays, or to their adjacent memory cell arrays including a redundant memory cell allay, depending on the voltage level at each part of the fuse pattern 11 that is divided by laser programming. The I/O port located immediately next to the blown point of the fuse pattern 11 is disconnected from the defective array and connected instead to its adjacent normal memory cell array, thus circumventing the problem.

In the example in FIG. 2, the fuse pattern on the right side of the blown point is driven to an "L" state after power-up, and this "L" state governs the third to fifth switch circuits 17c to 17e, because they are connected to the right-hand portion of the fuse pattern 11 through the third to fifth branching patterns 12c to 12e and third to fifth latch circuits 13c to 13e, respectively. They accordingly switch the selection from their respective default set of memory cell arrays 15c to 15e to the adjacent set of memory cell arrays 15d to 15f. Thus, the third I/O ports 14c is disconnected from the defective third memory cell array 15c and now connected to the fourth memory cell array 15d. In this way, the problem with the third memory cell array 15c is circumvented.

The above circuit structure permits the fuse pattern to be arranged as a linear pattern running in the direction parallel to the longitudinal axis of a rectangular guard ring. It also allows branching patterns to be drawn in a perpendicular direction to the guard ring axis. The proposed fuse patterns and guard rings take up less chip space than conventional ones.

The next section will described a second embodiment of the present invention.

Figure 4:
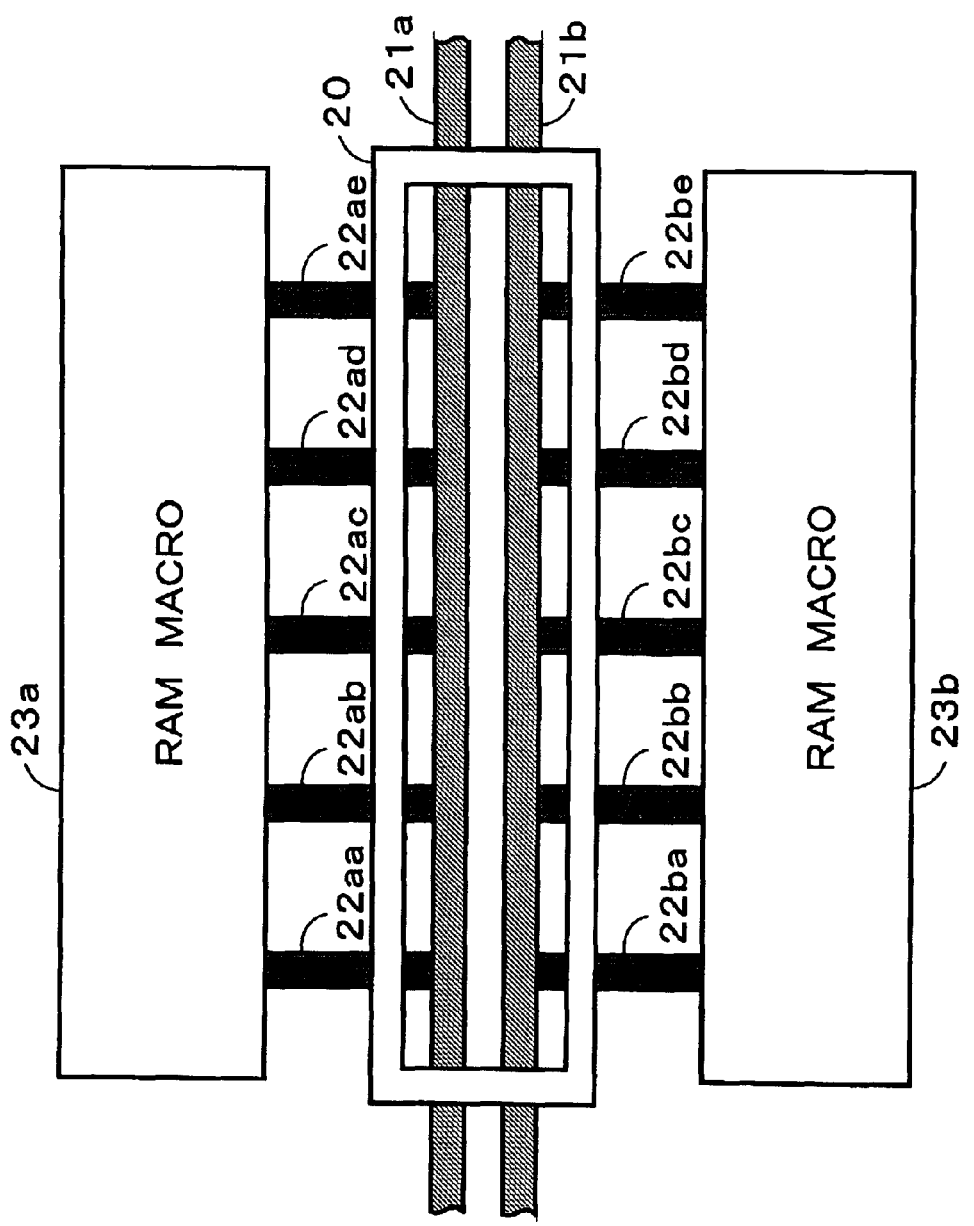
FIG. 4 is a diagram showing a structure of a semiconductor device according to a second embodiment of the invention.

FIG. 4 is a diagram showing a structure of a semiconductor device according to the second embodiment of the invention. As shown in FIG. 4, the semiconductor device includes a rectangular guard ring 20, first and second fuse patterns 21a and 21b running in the direction parallel to the longitudinal axis of the guard ring 20, a set of patterns 22aa to 22ae branching from the fuse pattern 21a and drawn out of the guard ring 20 in a direction perpendicular to the longitudinal axis of the guard ring 20, and another set of patterns 22ba to 22be branching from the second fuse pattern 21b and drawn out of the guard ring 20 in the other perpendicular direction to the longitudinal axis of the guard ring 20. The semiconductor device further includes a first RAM macro 23a connected to the first set of branching patterns 22aa to 22ae, and a second RAM macro 23b connected to the second set of branching patterns 22ba to 22be.

The RAM macros 23a and 23b each contain what have been described in the first embodiment as the memory cell arrays 4a to 4f (one of which is a redundant memory cell array), I/O ports 6a to 6e, and switch circuits 7a to 7e. For such RAM macro 23a and 23b, the corresponding fuse patterns 21a and 21b nullify a defective memory cell array and activate instead a redundant memory cell array.

By arranging two parallel fuse patterns within a single guard ring and drawing branching patterns from them in opposite directions as described above, the chip space of fuse patterns and guard rings can be reduced even when the semiconductor device includes many memory cell arrays.

The next section will describe a third embodiment of the present invention.

Figure 5:
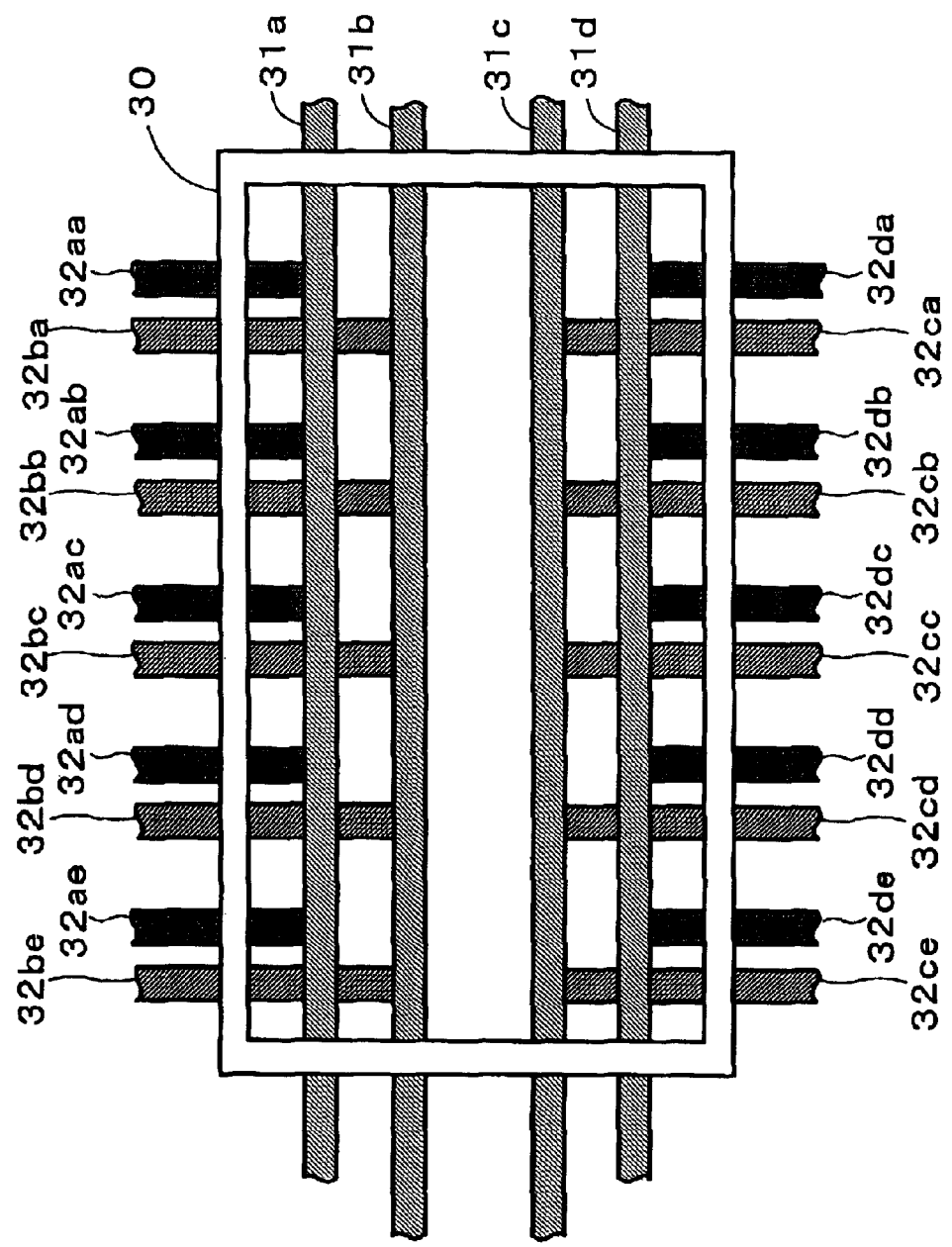
FIG. 5 is a diagram showing a structure of a semiconductor device according to a third embodiment of the invention.
Figure 6A:
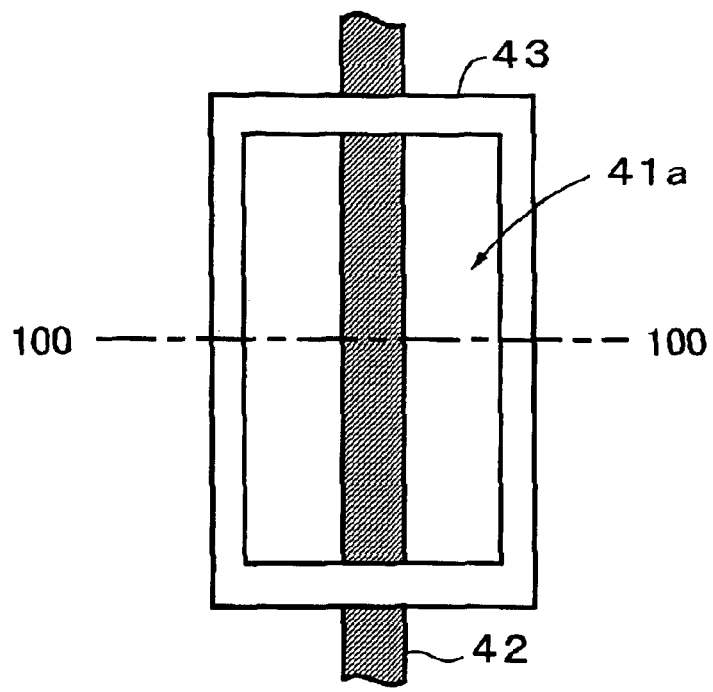
FIGS. 6(A) and (B) illustrate a guard ring and a fuse pattern formed on a semiconductor device. Specifically.
Figure 6B:
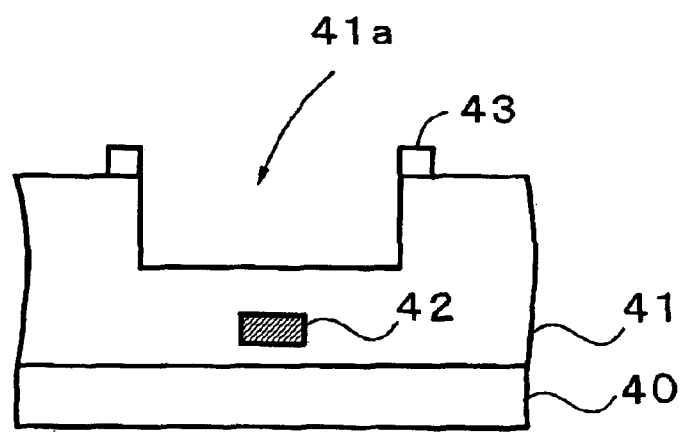
FIG. 6(B) is a cross-sectional view taken along line 1—1 in FIG. 6(A).

FIG. 5 is a diagram showing a structure of a semiconductor device according to the third embodiment of the invention. As shown in FIG. 5, the semiconductor device includes a rectangular guard ring 30, four parallel fuse patterns 31a to 31d running in the direction parallel to the longitudinal axis of the guard ring 30. The device also has a first set of patterns 32aa to 32ae branching from the first fuse pattern 31a and drawn out of the guard ring 30 in the direction perpendicular to the longitudinal axis of the guard ring 30. Likewise, a second set of patterns 32ba to 32be branch from the second fuse pattern 31b and are drawn out of the guard ring 30 in the direction perpendicular to the longitudinal axis of the guard ring 30. The semiconductor device further includes a third patterns 32ca to 32ce branching from the third fuse pattern 31c and drawn out of the guard ring 30 in the direction perpendicular to the longitudinal axis of the guard ring 30, and a fourth set of patterns 32da to 32de branching from the fourth fuse pattern 31d and drawn out of the guard ring 30 in the direction perpendicular to the longitudinal axis of the guard ring 30.

While not shown in FIG. 5, the first set of branching patterns 32aa to 32ae and the fourth set of branching patterns 32da to 32de are connected to two different RAM macros arranged on a certain layer of a semiconductor chip. Each of those RAM macros has the same structure as the RAM macros described in the second embodiment. Also not shown in FIG. 5, the second set of branching patterns 32ba to 32be and the third set of branching patterns 32ca to 32ce are connected to other RAM macros arranged on another layer. This layer is different from the layer accommodating the RAM macros to which the first and fourth sets of branching patterns 32aa to 32ae and 32da to 32de are connected.

All the four fuse patterns 31a to 31d are formed on a particular layer of the semiconductor chip. The branching patterns 32aa to 32ae, 32ba to 32be, 32ca to 32ce, and 32da to 32de are routed from the fuse pattern layer to other layers where the RAM macros reside.

According to the third embodiment of the present invention, a plurality of fuse patterns are formed under a single guard ring 30 and branching patterns are routed from those fuse patterns to different layers of the semiconductor chip. The proposed structure reduces the chip space for fuse patterns and guard rings even when the semiconductor device includes many memory cell arrays.

It is to be noted that in the first to third embodiments, there is no need to expand the guard ring in its minor axis direction even though each fuse pattern has to be blown at two spots to obtain a higher reliability of programming. Hence, the chip space for fuse patterns and guard rings can be reduced.

The above description have illustrated specific numbers of patterns branching from a fuse pattern, memory cell arrays, switch circuits, and other elements for explanatory purposes. Those numbers are, however, only for example, and it is not intended to limit such numerical parameters to any specific values.

As can be seen from the above description, the present invention provides a fuse pattern that is running in the direction parallel to the longitudinal axis of a rectangular guard ring, and branching patterns are connected to the fuse pattern and drawn out of the guard ring in the direction perpendicular to the longitudinal axis of the guard ring. The chip space for fuse patterns and guard rings can thus be reduced.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device with fuses for repairing a defect found therein, comprising:

a guard ring;

a fuse pattern running in a direction parallel to longitudinal axis of said guard ring;

a plurality (n) of branching patterns branching from said fuse pattern and being drawn out of said guard ring in a direction perpendicular to the longitudinal axis of said guard ring;

a plurality (n+1) of memory cell arrays, the (n+1)th memory cell array being a redundant memory cell array;

a plurality (n) of input/output ports for receiving and sending memory signals; and a plurality (n) of switch circuits, coupled to different points on said fuse pattern through said plurality of branching patterns, which switch connection between said input/output ports and memory cell arrays, the ith switch circuit (i=1 . . . n) selecting either the ith memory cell array or the (i+1)th memory cell array, depending on which segment of said fuse pattern is blown.

2. The semiconductor device according to claim 1, wherein:

said blowing divides said fuse pattern into two parts; and one part of the divided fuse pattern is brought into L state and the other part is brought into H state.

3. The semiconductor device according to claim 2, wherein:

when the ith memory cell array is found defective, said blowing of said fuse pattern is performed at a point that is adjacent to where the ith branching pattern branches off;

said plurality of branching patterns deliver the L and H states of the two parts of said divided fuse pattern to said switch circuits; and said switch circuits switch the connection between said input/output ports and memory cell arrays, depending on whether each branching pattern coupled thereto is in L state or H state, whereby the ith input/output port is connected to the (i+1)th memory cell array adjacent to the defective ith memory cell array.

4. The semiconductor device according to claim 1, further comprising a reset circuit which first brings said fuse pattern into one of L and H states by applying a first voltage to one end of said fuse pattern when said semiconductor device is powered up, and then brings said fuse pattern into the other of L and H states by applying a second voltage to the other end of said fuse pattern.

5. The semiconductor device according to claim 4, further comprising a plurality (n) of latch circuits, coupled to different points on said fuse pattern through said plurality of branching patterns, which memorize said one of L and H states at each different point of said blown fuse pattern after the first voltage is removed from said one end of said fuse pattern.

6. The semiconductor device according to claim 1, further comprising:

another fuse pattern formed under said guard ring; and
   another set of branching patterns branching from said another fuse pattern.

7. The semiconductor device according to claim 6, wherein said two sets of branching patterns are routed to different layers of the semiconductor device.

* * * * *